United States Patent
Cheng et al.

(10) Patent No.: US 7,646,210 B2
(45) Date of Patent: Jan. 12, 2010

(54) METHOD AND SYSTEM FOR LOW-POWER LEVEL-SENSITIVE SCAN DESIGN LATCH WITH POWER-GATED LOGIC

(75) Inventors: Zhibin Cheng, Cary, NC (US); Robert G. Gerowitz, Raleigh, NC (US); Claudia M. Tartevet, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 379 days.

(21) Appl. No.: 11/620,137

(22) Filed: Jan. 5, 2007

(65) Prior Publication Data

US 2008/0164912 A1    Jul. 10, 2008

(51) Int. Cl.
*H03K 19/00* (2006.01)
*G01R 31/28* (2006.01)

(52) U.S. Cl. ............................ 326/16; 326/82; 326/46; 714/726

(58) Field of Classification Search ............... 326/82, 326/16, 46; 327/202, 203, 208, 214; 714/726
See application file for complete search history.

(56) References Cited

U.S. PATENT DOCUMENTS

| | | |
|---|---|---|
| 6,762,638 B2 * | 7/2004 | Correale et al. ............. 327/202 |
| 7,391,249 B2 * | 6/2008 | Lee et al. ..................... 327/202 |
| 2003/0067322 A1 * | 4/2003 | Stan et al. ..................... 326/46 |

* cited by examiner

*Primary Examiner*—Daniel D Chang
(74) *Attorney, Agent, or Firm*—Dillon & Yudell LLP

(57) ABSTRACT

A method of preventing current leakage in logic circuits within level sensitive scan design (LSSD) latch circuits in an application specific integrated circuit (ASIC). When the ASIC is in a manufacturing test mode, a gating signal at an input terminal of a power gating circuit is set to exceed a threshold voltage of transistors within the power gating circuit. The gating signal thus causes the power gating circuit to enable electrical current to reach the LSSD latch circuits. When the ASIC is in a normal functional mode, the gating signal is set below the threshold voltage. The gating signal thus causes the power gating circuit to prevent electrical current from reaching particular logic circuits (e.g., scan logic) within the LSSD latch circuits, thereby conserving power within the ASIC by preventing current leakage and heat generation in the LSSD latch circuit.

20 Claims, 6 Drawing Sheets

METHOD AND SYSTEM FOR LOW-POWER LEVEL-SENSITIVE SCAN DESIGN LATCH WITH POWER-GATED LOGIC

BACKGROUND OF THE INVENTION

1. Technical Field

The present invention relates in general to the field of application specific integrated circuits (ASICs) and in particular to latch circuits. Still more particularly, the present invention relates to an improved method and system for preventing current leakage in level sensitive scan design (LSSD) latch circuits.

2. Description of the Related Art

Application-specific integrated circuits (ASICs) are integrated circuits (ICs) that are customized for one or more particular uses. Latches include multiple logic gate circuits and are used to store information in asynchronous sequential logic systems. Since a single latch circuit can store one bit of information, multiple latches are typically utilized within an ASIC. As circuit geometries continue to get smaller, the power density of conventional ASICs is becoming prohibitively large.

In conventional ASICs, power is primarily consumed by active logic when signal values change. However, power can also be lost due to leakage from the source to drain. As circuit density increases, the ratio between the number of pins contacted by a circuit tester and the amount of random logic contained in a design decreases, thereby making it more difficult for manufacturing tests to discover manufacturing defects (e.g., stuck at 0 or stuck at 1).

In order to increase the observability and controllability of internal logic of circuit designs, designers often utilize level sensitive scan design (LSSD). LSSD provides points within an ASIC design where a tester can directly scan values during manufacturing test. After a circuit passes manufacturing test (i.e. in functional mode), the scan clocks are typically tied off from the scan logic portion of the LSSD latch. However, the scan logic portion of the latch is still typically connected to the power source of the ASIC, which allows the scan logic portion of the LSSD latch circuit to continue to leak current. Current leakage that occurs when the ASIC is in functional mode causes the scan logic portion of the LSSD latch circuit to consume additional energy and generate unnecessary heat. Since conventional ASICs may include millions of latches, even a small amount of current leakage in each latch can produce a large cumulative power loss. Consequently, an improved method for reducing power consumption by preventing current leakage in LSSD latch circuits is needed.

SUMMARY OF THE INVENTION

Disclosed is a method and system for preventing current leakage in scan logic circuits within level sensitive scan design (LSSD) latch circuits in an application specific integrated circuit (ASIC). A gating signal applied to an input terminal of a power gating circuit is used to selectively activate the scan logic portion of a LSSD latch within an ASIC when the ASIC is undergoing manufacturing-related tests. In one embodiment, the power gating circuit contains multiple field effect transistors (FETs) and a logical inverter. The gating signal is applied to the gate of the FETs and turns on/off transistors within the power gating circuit. When the ASIC is in normal functional mode (i.e. after manufacturing tests are completed), the gating signal is set below a threshold voltage of the FETs, such that the FETs within the power gating circuit prevent current from flowing to the scan logic circuits within the LSSD latches. The deactivation of the scan logic circuits within the LSSD latches thus conserves power when the ASIC is in normal functional mode by preventing current leakage and heat generation within the scan logic circuits within the LSSD latches.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The present invention provides a method and system for preventing current leakage in the scan logic portion of a level sensitive scan design (LSSD) latch circuit within an application specific integrated circuit (ASIC).

Figure 1:
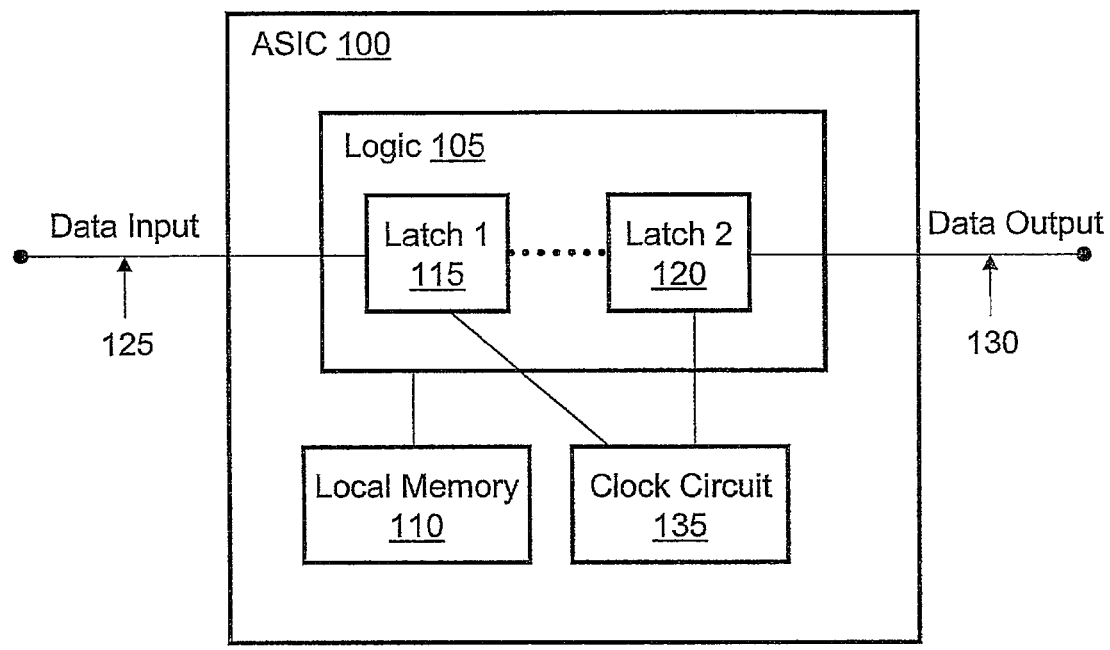
FIG. 1 depicts a high level block diagram of an application specific integrated circuit (ASIC), according to an embodiment of the present invention.

With reference now to FIG. 1, there is depicted a high level block diagram of ASIC 100, according to an embodiment of the present invention. ASIC 100 includes logic 105, local memory 110, and clock circuit 135. Logic 105 includes LSSD latch 1 115, which is coupled to LSSD latch 2 120. As utilized herein, LSSD refers to a circuit design, which includes multiple points within the circuit that a user may scan signal values to when testing the circuit. Local memory 110 may be utilized by additional circuits (not shown) within logic 105 of ASIC 100. Clock circuit 135, which is coupled to LSSD latch 1 115 and LSSD latch 2 120, can produce one or more periodic clock signals that are utilized by various electrical components within logic 105. In other embodiments, logic 105 may include more than two interconnected LSSD latches, and the present configuration of logic 105 is provided solely for illustration and not meant to imply any limitations on the invention.

According to the illustrative embodiment, ASIC 100 receives input signals at data input 125 and subsequently produces output signals at data output 130. As shown, LSSD latch 1 115 is coupled to data input 125, and LSSD latch 2 120 is coupled to data output 130. During the operation of ASIC 100, LSSD latch 1 115 performs one or more logic functions using signals from data input 125 and clock circuit 135 prior to passing intermediate output signals to LSSD latch 2 120. LSSD latch 2 120 performs one or more logic functions using input from LSSD latch 1 115 and clock circuit 135 and produces output signals at data output 130.

Within the descriptions of the figures, similar elements are provided similar names and reference numerals as those of the previous figure(s). Where a later figure utilizes the element in a different context or with different functionality, the element is provided a different leading numeral representative of the figure number (e.g., 1xx for FIGS. 1 and 2xx for FIG. 2). The specific numerals assigned to the elements are provided solely to aid in the description and not meant to imply any limitations (structural or functional) on the invention.

Figure 2A:
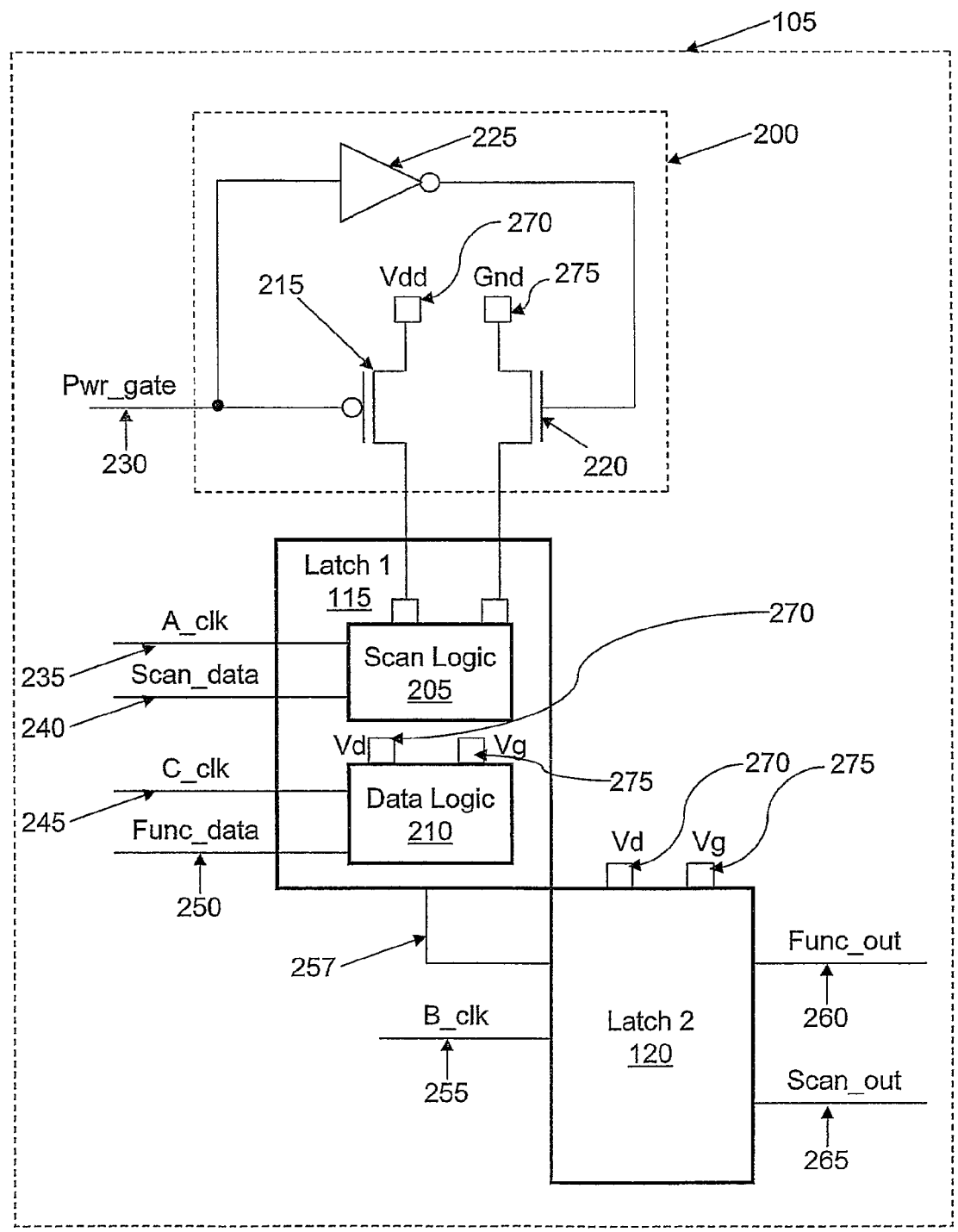
FIG. 2A illustrates a schematic diagram of a power gating circuit coupled to a first level sensitive scan design (LSSD) latch circuit that includes separate scan logic and data logic and a second LSSD latch circuit that is composed entirely of scan logic, according to an embodiment of the present invention.

With reference now to FIG. 2A, there is depicted a schematic diagram of power gating circuit 200 in relation to LSSD latch circuit 1 115 and LSSD latch circuit 2 120, according to an embodiment of the present invention. LSSD latch 1 115 includes scan logic 205 and data logic 210. The terminal of clock signal "A_clk" 235 and the terminal of input signal "Scan_data" 240 are coupled to the input terminals of scan logic 205. Similarly, the terminal of clock signal "C_clk" 245 and the terminal of input signal "Func_data" 250 are coupled to the input terminals of data logic 210. Additionally, the terminal of clock signal "B_clk" 255 is coupled to LSSD latch 2 120. A second input terminal of LSSD latch 2 120 is coupled to the intermediate output from LSSD latch 1 115 via latch connection 257. LSSD latch 2 120 produces output signals "Func_out" 260 and "Scan_out" 265, which make up data output 130 of FIG. 1.

LSSD latch 1 115 and LSSD latch 2 120 both include power terminals at which power supply (i.e., drain voltage (Vdd) 270 and ground voltage (Gnd) 275) may be coupled to the latches or components thereof. Specifically, both scan logic 205 and data logic 210 of LSSD latch 1 are provided separate terminals for connecting to power supply, Vdd 270 and Gnd 275. In the present embodiment, scan logic 205 connects to power supply via power gating circuit 200, as described below.

According to the illustrative embodiment, power gating circuit 200 includes p-type field effect transistor (PFET) 215, n-type FET (NFET) 220, and inverter 225. The input terminal for gating signal "Pwr_gate" 230 is coupled to the gate of PFET 215 and to the input of inverter 225. The output of inverter 225 is coupled to the gate of NFET 220. The source of PFET 215 is coupled to Vdd 270, and the drain of PFET 215 is coupled to a first power terminal of scan logic 205. Similarly, the drain of NFET 220 is coupled to Gnd 275, and the source of NFET 220 is coupled to a second power terminal of scan logic 205.

In one embodiment, gating signal Pwr_gate 230 is a static signal. When gating signal Pwr_gate 230 exceeds a threshold voltage, PFET 215 turns on and current flows through PFET 215. Concurrently, inverter 225 inverts the gating signal Pwr_gate 230 (from a high to a low voltage) at the gate of NFET 200, and the inverter signal turns on NFET 220 and current flows through NFET 220. As utilized herein, a threshold voltage refers to a voltage applied to the gate of a PFET or NFET that enables the respective device to turn on and enable current to flow through a channel within the PFET or NFET. The value of the threshold voltages and thus the value of Pwr_gate 230 is based on the size and operating characteristics of PFET 215 and NFET 220. This value is provided as a design characteristic of the overall circuit.

The embodiments of the invention assume that the threshold voltage of NFET transistor 220, i.e., the voltage at which NFET transistor 220 turns on, is the inverse of the threshold voltage at which PFET 215 turns on. For clarity in differentiating between these two different threshold voltages, the threshold voltage for PFET 215 is referred to as a high threshold voltage, indicating that a "high" voltage magnitude turns on PFET 215. Also, the threshold voltage for NFET 220 is referred to as a low threshold voltage, indicating that a "low" voltage magnitude turns on NFET 220. Design of power gating circuit 200 involves use of transistors with determinable operating characteristics based on a known value of gating signal Pwr_gate 230 that turns on both transistors. In implementation, PFET 220 turns on for all gate voltages that are at or above (i.e., at least as high as) the high threshold voltage. Likewise, NET 215 turns on for all gate voltages that are at or below (i.e., at most as high as) the low threshold value. A particular voltage magnitude of Pwr_gate 230 is thus defined as the "threshold voltage" for the entire power gating circuit 200. Inverter 225 then provides the correct low threshold voltage once the input signal Pwr_gate 230 is at or above the high threshold voltage.

In one embodiment, the connections of PFET 215 and NFET 220 relative to Vdd 270 and Gnd 275 and the power terminals of scan logic 205 are reversed With this embodiment, inverter 225 is still coupled between the input terminal of Pwr_gate 230 and the gate of NFET 220, and the input terminal of gating signal Pwr_gate 230 is still coupled directly to the gate of PFET 215. As with the previous embodiment, when gating signal Pwr_gate 230 exceeds the threshold voltage, PFET 215 and NFET 220 enable current to flow through scan logic 205. However, when Pwr_gate 230 is below the threshold voltage, PFET 215 and NFET 220 both turn off and prevent current flow and thus prevent current leakage through scan logic 205.

In an alternate embodiment, power gating circuit 200 is designed to turn off power to scan logic 205 based on a receipt of a high voltage at Pwr_gate 230. With this embodiment, the configuration of PFET 215 and NFET 220 relative to Vdd 270 and Gnd 275, the power terminals of scan logic 205, and inverter 225 are changed, such that inverter couples the input terminal of Pwr_gate 230 to the gate of PFET and the input terminal of gating signal Pwr_gate 230 is coupled to the gate of NFET 220. With this configuration, when gating signal Pwr_gate 230 is below a threshold voltage, PFET 215 and NFET 220 enable current to flow through scan logic 205. However, when Pwr_gate 230 is at or above the threshold voltage, PFET 215 and NFET 220 both turn off and prevent current flow and thus prevent current leakage through scan logic 205.

The remaining descriptions of illustrative embodiments of the invention (FIGS. 2B-2D and 3) are provided from the perspective of a power gating signal designed as illustrated in FIG. 2A, and the above alternate embodiment is provided solely as an alternative.

During the manufacturing test process of ASIC 100, scan logic 205 within LSSD latch 1 115 can verify the performance of various components within ASIC 100. In conventional LSSD latch 1 circuits, power is continuously applied to the scan logic after the manufacturing test processes (i.e., during normal functional operation of ASIC 100), thereby producing leakage current and heat. In an effort to reduce leakage current and heat in LSSD latch 1 115, clock signal A_clk 235 is typically tied off when the conventional ASIC is in a normal functional mode (i.e., after the manufacturing test process is completed). However, in such embodiments, the conventional scan logic typically remains connected to Vdd 270 and Gnd 275, and thus continues to consume power even when clock signal A_clk is tied off. According to the illustrative embodiment, power gating circuit 200 enables gating signal Pwr_gate 230 to selectively prevent scan logic 205 and/or data logic 210 from consuming power, according to the process illustrated in FIG. 3 and described below. FIGS. 2A-2D illustrates four different latch configurations, which are each configured with power gating circuit 200 coupled to the scan and/or data logic within the latches to prevent current leakage within the respective devices.

Figure 2B:
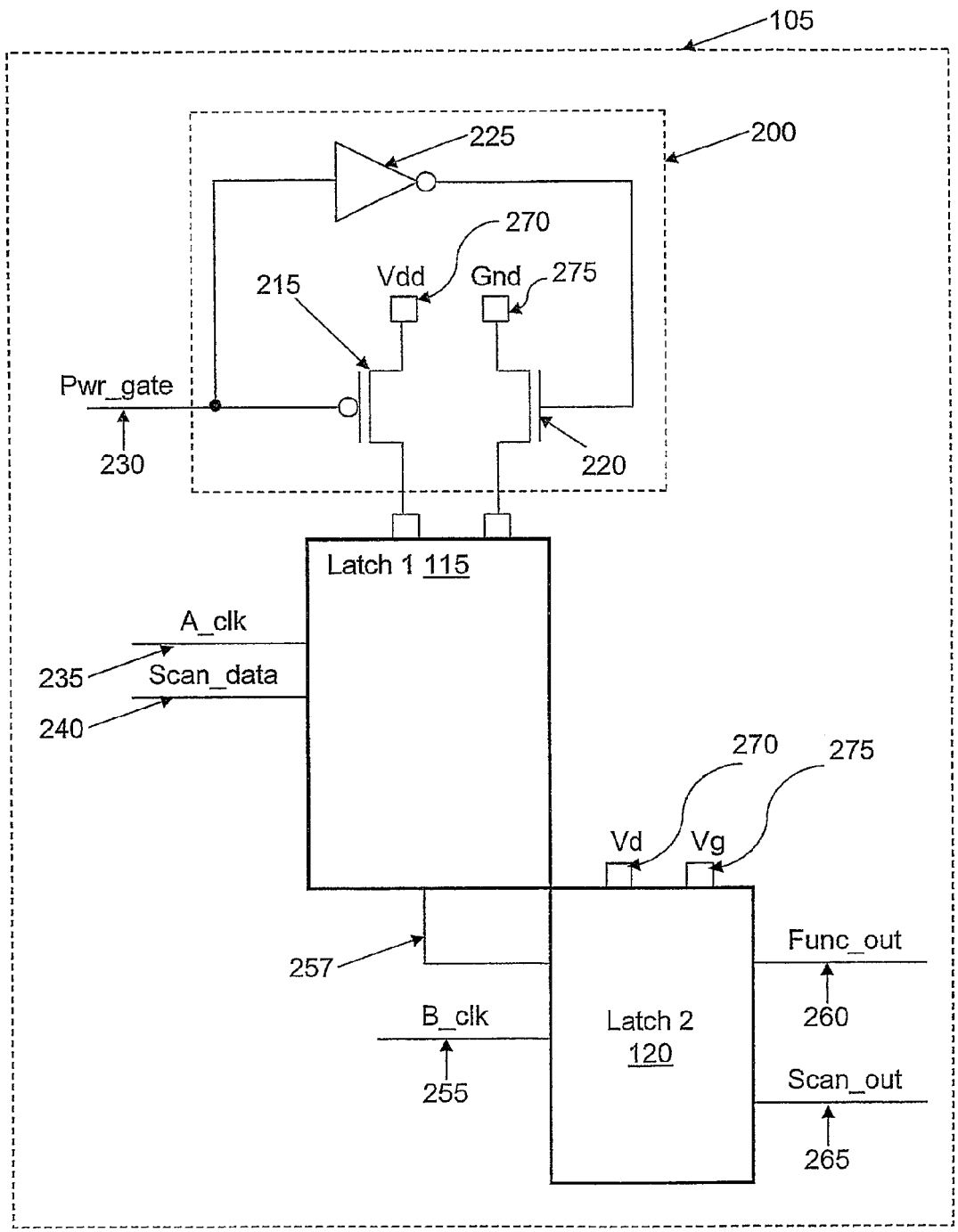
FIG. 2B illustrates a schematic diagram of a power gating circuit coupled to a first LSSD latch circuit that is composed entirely of scan logic and a second LSSD latch circuit that is composed entirely of scan logic, according to an embodiment of the present invention.

With reference now to FIG. 2B, there is depicted a schematic diagram of another embodiment of the invention, in which power gating circuit 200 is coupled to LSSD latch 1 115. LSSD latch 1 115 is composed entirely of scan logic 205, and thus power gating circuit 200 is utilized to selectively disable current flow to all circuits within latch 1 115.

Figure 2C:
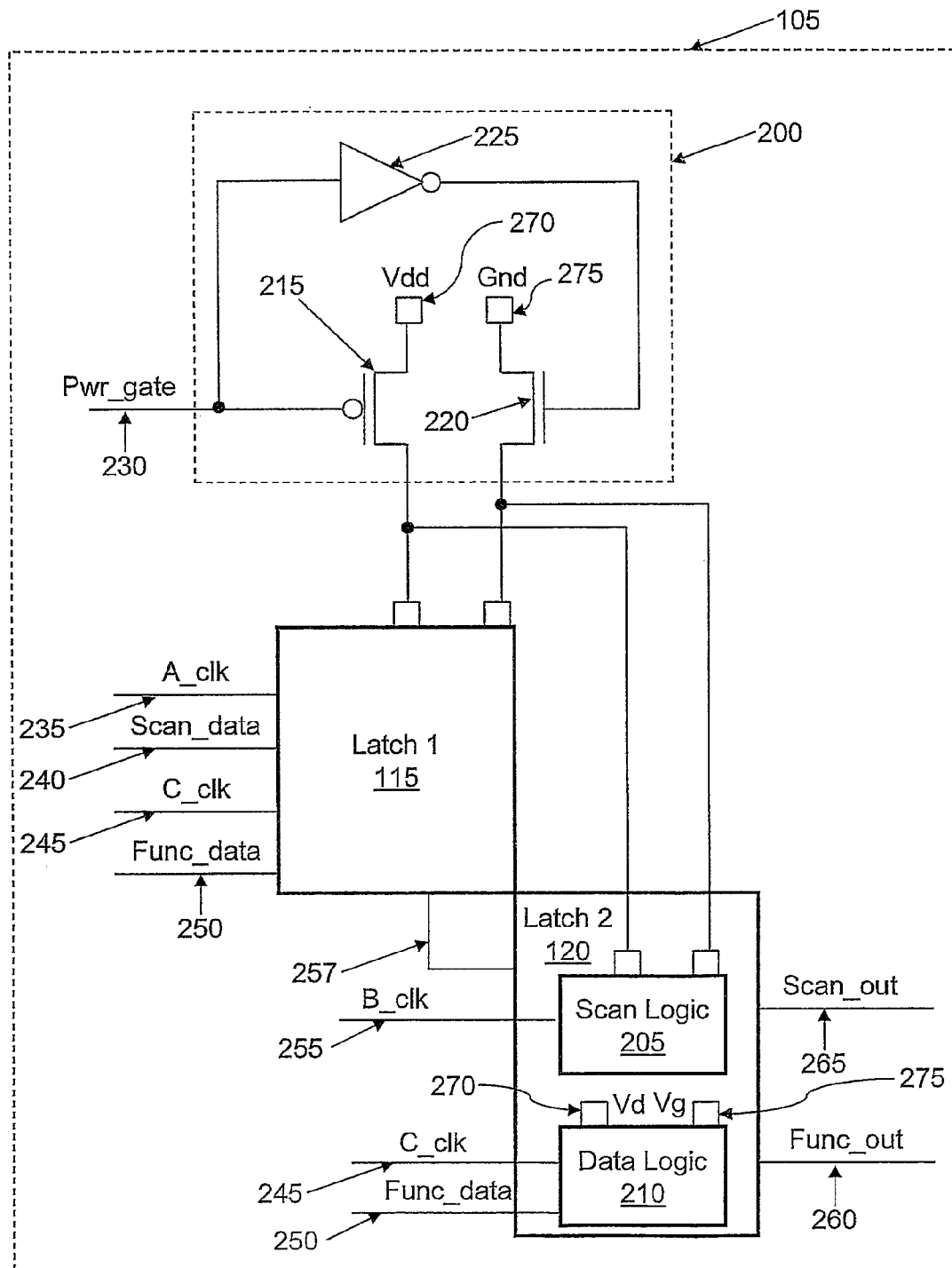
FIG. 2C illustrates a schematic diagram of a power gating circuit coupled to both a first LSSD latch circuit that includes separate scan logic and data logic, and a second LSSD latch circuit that includes separate scan logic and data logic, according to an embodiment of the present invention.

With reference now to FIG. 2C, there is depicted a schematic diagram of another embodiment of the invention, in which power gating circuit 200 is coupled to both LSSD latch 1 115 and scan logic 205 of LSSD latch 2 120. LSSD latch 1 115 is composed of both scan logic and data logic, LSSD latch 2 120 includes both scan logic 205 and data logic 210. Power gating circuit 200 can thus selectively disable current flow to all circuits within latch 1 115 and scan logic 205 within latch 2 120.

Figure 2D:
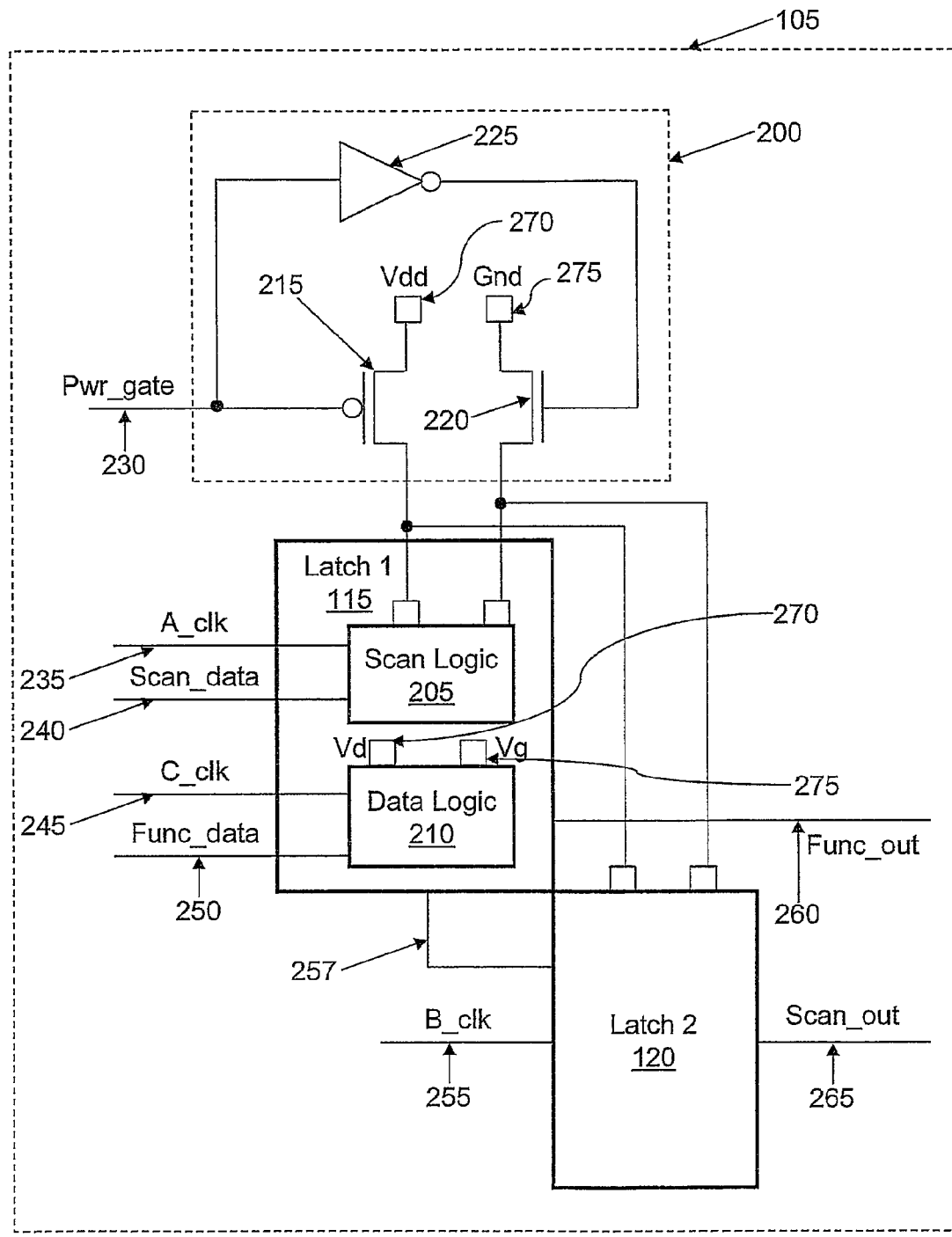
FIG. 2D illustrates a schematic diagram of a power gating circuit coupled to both a first LSSD latch circuit that contains separate scan logic and data logic and a second LSSD latch circuit composed entirely of scan logic, according to an embodiment of the present invention.

Similarly, FIG. 2D is a schematic diagram of yet another embodiment of the invention, in which power gating circuit 200 is coupled to both scan logic 205 of LSSD latch 1 115 and to LSSD latch 2 120. LSSD latch 1 115 includes both scan logic 205 and data logic 210, while LSSD latch 2 120 is composed entirely of scan logic. Power gating circuit 200 can thus selectively disable current flow to scan logic 205 within latch 1 115 and all circuits within latch 2 120.

Figure 3:
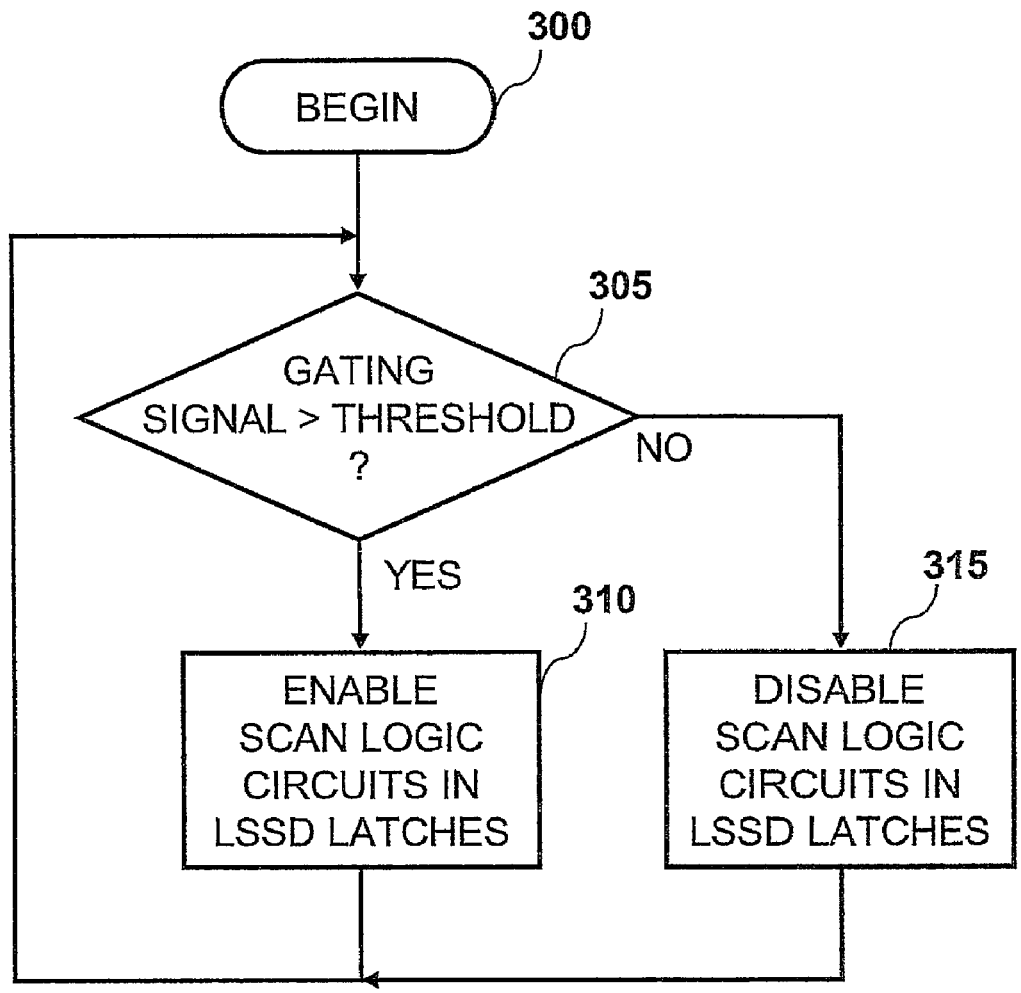
FIG. 3 is a high level logical flowchart of an exemplary method of preventing current leakage in the scan logic circuits within LSSD latch circuits in an ASIC in accordance with one embodiment of the invention.

Turning now to FIG. 3, there is illustrated a high level logical flowchart of an exemplary method of preventing current leakage in the latch circuits of FIG. 2A, in accordance with one embodiment of the invention. The process begins at block 300 in response to ASIC 100 receiving power. At block 305, a determination is made by power gating circuit 200 whether gating signal Pwr_gate 230 is at or above the threshold voltage value (for turning on the transistors within power gating circuit 200). If gating signal Pwr_gate 230 is at/above the threshold voltage, PFET 215 and NFET 220 turn on (as described above) and enable current to flow from/to Vdd 270 and Gnd 275, respectively, through scan logic 205 within LSSD latch 1 115, as depicted in block 310. Current continues to flow through PFET 215 and NFET 220 until the value of gating signal Pwr_gate 230 changes to below the threshold voltage. In the circuit configurations of FIGS. 2B-2D, the current flow turns on all logic components (within both LSSD latch 1 115 and LSSD latch 2 120) that are connected to the drain and source terminals of PFET 215 and NFET 22, respectively.

If gating signal Pwr_gate 230 is below the threshold value, PFET 215 and NFET 220 prevent current from flowing from/to Vdd 270 and Gnd 275, respectively, through scan logic 205 within LSSD latch 1 115. No current flows through PFET 215 and NFET 220 until the value of gating signal Pwr_gate 230 changes to above threshold voltage. In the circuit configurations of FIGS. 2B-2D, stopping the current flow turns off all logic components (within both LSSD latch 1 115 and LSSD latch 2 120) that are connected to the drain and source terminals of PFET 215 and NFET 22, respectively.

The present invention thus enables selective activation of (i.e., current flow to) logic within LSSD latch 1 115 and/or LSSD latch 2 120 during the manufacturing test process of ASIC 100 and selective deactivation of (i.e., blocking of current flow to) specific circuit components (e.g., scan logic 205 of FIGS. 2A-2D) when ASIC 100 is in a normal functional mode, thereby conserving power within the ASIC by preventing current leakage and heat generation within the scan logic portions (and possibly other components) of LSSD latch 1 115 and/or LSSD latch 2 120.

It is understood that the use herein of specific names are for example only and not meant to imply any limitations on the invention. The invention may thus be implemented with different nomenclature/terminology and associated functionality utilized to describe the above devices/utility, etc., without limitation. While transistors are described herein as FETs, other types of transistor design may be utilized, including, but not limited to, bipolar junction transistors (BJTs), metal oxide semiconductor (MOS) transistors, and compound metal oxide semiconductor (CMOS) transistors.

While the invention has been particularly shown and described with reference to a preferred embodiment, it will be understood by those skilled in the art that various changes in form and detail may be made therein without departing from the spirit and scope of the invention.

What is claimed is:

1. A circuit comprising:
   one or more latch circuits;
   at least one logic within the one or more latch circuits; and
   a power gating circuit which is separate from the at least one logic of the one or more latch circuits and is coupled to said at least one logic, wherein the power gating circuit: (a) enables deterministic prevention of a flow of electrical current to and from the at least one logic via the power gating circuit during normal operation of the one or more latch circuits; and (b) enables current flow from the power gating circuit through the at least one logic and back to the power gating circuit only when the one or more latch circuits are in a test mode.

2. The circuit of claim 1, wherein said power gating circuit comprises:
   a first voltage connection for coupling the power gating circuit to a voltage power source;
   a ground voltage connection for coupling the power gating circuit to a ground reference; and
   a first transistor having a source terminal coupled to said first voltage connection and a drain terminal coupled to said at least one logic; and
   a power gating input coupled to a gate of the first transistor and at which is received a first input voltage, with a selectable magnitude.

3. The circuit of claim 2, wherein the power gating circuit further comprises:
   a second transistor having a source terminal coupled to said at least one logic and a drain terminal coupled to said ground voltage connection, wherein said at least one logic is coupled between the drain terminal of the first transistor and the source terminal of the second transistor; and
   an inverter having an input terminal coupled to the power gating input and an output terminal coupled to a gate terminal of the second transistor, said inverter providing an inverted input voltage at the output terminal;

wherein the second transistor turns on for a threshold voltage whose value is the inverse of the threshold voltage at which the first transistor turns on.

4. The circuit of claim 2, wherein:
the first transistor turns on for voltages at or above a high threshold voltage and turns off for all lower voltages and the first transistor detects a voltage magnitude of the first input voltage and when the magnitude of the first input voltage is at least the high threshold voltage required to turn the first transistor on, the first transistor turns on and enables current to flow through the first transistor from the voltage power source to the at least one logic; and
when the magnitude of the first input voltage is below the high threshold voltage, the first transistor shuts off and prevents current from flowing through the first transistor.

5. The circuit of claim 3, wherein:
the second transistor turns on for voltages at or below a low threshold voltage which is the inverted value of the voltage that turns on the first transistor and the second transistor turns off for all higher voltages;
when the second transistor detects that a voltage magnitude of the inverted input voltage is at most a low threshold voltage required to turn the second transistor on, the second transistor turns on and enables current to flow through the second transistor from the at least one logic to the ground voltage connection; and
when the magnitude of the inverted input voltage is above the low threshold voltage required to turn the second transistor on, the second transistor shuts off and prevents current from flowing through the second transistor.

6. The circuit of claim 2, wherein:
the first transistor turns on for voltages at or below a low threshold voltage and turns off for higher voltages and the first transistor detects a voltage magnitude of the first input voltage and when the magnitude of the first input voltage is at most the low threshold voltage required to turn the first transistor on, the first transistor turns on and enables current to flow through the first transistor from the voltage power source to the at least one logic; and
when the magnitude of the first input voltage is above the low threshold voltage, the first transistor shuts off and prevents current from flowing through the first transistor.

7. The circuit of claim 3, wherein:
the second transistor turns on for voltages at or above a high threshold voltage which is the inverted value of a low threshold voltage that turns on the first transistor and the second transistor turns off for all lower voltages;
when the second transistor detects that a voltage magnitude of the inverted input voltage is at least a high threshold voltage required to turn the second transistor on, the second transistor turns on and enables current to flow through the second transistor from the at least one logic to the ground voltage connection; and
when the inverted input voltage is below the high threshold voltage required to turn the second transistor on, the second transistor shuts off and prevents current from flowing through the second transistor.

8. The circuit of claim 1, wherein said one or more latch circuits are level sensitive scan design (LSSD) latch circuits configured in one of a plurality of latch circuit designs from among:
a first two latch LSSD configuration with a first LSSD latch circuit that includes separate scan logic and data logic and does not include a functional data output coupled to a second LSSD latch circuit composed of scan logic and said functional data output;
a second two latch LSSD configuration with a first LSSD latch circuit composed entirely of scan logic and a second LSSD latch circuit composed of scan logic and said functional data output;
a third two latch LSSD configuration with a first LSSD latch circuit and a second LSSD latch circuit that both include separate scan logic and data logic; and
a fourth two latch LSSD configuration with a first LSSD latch circuit that contains separate scan logic and data logic and said functional data output and a second LSSD latch circuit composed entirely of scan logic.

9. The circuit of claim 2, wherein:
when the first transistor turns on for a high threshold voltage, the magnitude of said first input voltage at said power gating input is set to at least the high threshold voltage of said first transistor during a manufacturing test mode of said circuit; and
when the first transistor turns on only for a high threshold voltage, the magnitude of the first input voltage at said power gating input is set to below the high threshold voltage during normal functional mode of the circuit, whereby the power gating circuit prevents electrical current from reaching said at least one logic within said one or more latch circuits during the normal functional mode of said circuit.

10. The circuit of claim 1, wherein the circuit is an integrated circuit.

11. The circuit of claim 1, wherein the circuit is an application specific integrated circuit (ASIC).

12. An application specific integrated circuit (ASIC) comprising:
one or more latch circuits;
at least one functional logic within the one or more latch circuits; and
a power gating circuit which is separate from the at least one logic of the one or more latch circuits and is coupled to said at least one logic, wherein the power gating circuit: (a) enables deterministic prevention of a flow of electrical current to and from the at least one logic via the power gating circuit during normal operation of the one or more latch circuits; and (b) enables current flow from the power gating circuit through the at least one logic and back to the power gating circuit only when the one or more latch circuits are in a test mode.

13. The ASIC of claim 12, wherein said power gating circuit comprises:
a first voltage connection for coupling the power gating circuit to a voltage power source;
a ground voltage connection for coupling the power gating circuit to a ground reference; and
a first transistor having a source terminal coupled to said first voltage connection and a drain terminal coupled to said at least one logic; and
a power gating input coupled to a gate of the first transistor and at which is received a first input voltage, with a selectable magnitude
a second transistor having a source terminal coupled to said at least one logic and a drain terminal coupled to said ground voltage connection, wherein said at least one logic is coupled between the drain terminal of the first transistor and the source terminal of the second transistor; and
an inverter having an input terminal coupled to the power gating input and an output terminal coupled to a gate terminal of the second transistor, said inverter providing an inverted input voltage at the output terminal;
wherein the second transistor turns on for a threshold voltage whose value is the inverse of the threshold voltage at which the first transistor turns on.

14. The ASIC of claim 13, wherein:
when the magnitude of the first input voltage is at least a high threshold voltage required to turn the first transistor on, current flows through the first transistor from the voltage power source to the at least one logic;
when the magnitude of the first input voltage is below the high threshold voltage, no current flows through the first transistor;
when the magnitude of the first input voltage is at least the high threshold voltage required to turn the first transistor on, the inverted input voltage is at most a low threshold voltage required to turn the second transistor on and current flows through the second transistor from the at least one logic to the ground voltage connection; and
when the magnitude of the inverted input voltage is above the low threshold voltage required to turn the second transistor on, no current flows through the second transistor.

15. The ASIC of claim 13, wherein:
when the magnitude of the first input voltage is at most a low threshold voltage required to turn the first transistor on, current flows through the first transistor from the voltage power source to the at least one logic;
when the magnitude of the first input voltage is above the low threshold voltage, no current flows through the first transistor;
when the magnitude of the first input voltage is at most the low threshold voltage required to turn the first transistor on, the inverted input voltage is at least a high threshold voltage required to turn the second transistor on and current flows through the second transistor from the at least one logic to the ground voltage connection; and
when the inverted input voltage is below the high threshold voltage required to turn the second transistor on, no current flows through the second transistor.

16. The ASIC of claim 12, wherein said one or more latch circuits are level sensitive scan design (LSSD) latch circuits configured in one of a plurality of latch circuit designs from among:
a first two latch LSSD configuration with a first LSSD latch circuit that includes separate scan logic and data logic and does not include a functional data output coupled to a second LSSD latch circuit composed of scan logic and said functional data output;
a second two latch LSSD configuration with a first LSSD latch circuit composed entirely of scan logic and a second LSSD latch circuit composed of scan logic and said functional data output;
a third two latch LSSD configuration with a first LSSD latch circuit and a second LSSD latch circuit that both include separate scan logic and data logic; and
a fourth two latch LSSD configuration with a first LSSD latch circuit that contains separate scan logic and data logic and said functional data output and a second LSSD latch circuit composed entirely of scan logic.

17. The ASIC of claim 13, wherein:
when the first transistor turns on for a high threshold voltage, the magnitude of said first input voltage at said power gating input is set to at least the high threshold voltage of said first transistor during a manufacturing test mode of said ASIC; and
when the first transistor turns on only for a high threshold voltage, the magnitude of the first input voltage at said power gating input is set to below the high threshold voltage during normal functional mode of the ASIC, whereby the power gating circuit prevents electrical current from reaching said at least one logic within said one or more latch circuits during the normal functional mode of said ASIC.

18. A method comprising:
coupling a power gating circuit to logic within one or more level sensitive design (LSSD) latch circuits within an integrated circuit (IC) having functional logic, wherein the power gating circuit is separate from and external to functional logic of the one or more LSSD latch circuits and wherein the power gating circuit: (a) enables deterministic prevention of a flow of electrical current to and from the at least one logic via the power gating circuit during normal operation of the one or more latch circuits; and (b) enables current flow from the power gating circuit through the at least one logic and back to the power gating circuit only when the one or more latch circuits are in a test mode;
deterministically enabling the functional logic within the one or more LSSD latch circuits to operate during a testing phase of the IC by applying a first input voltage to the power gating circuit to turn on components within the power gating circuit and allow current flow to and from the functional logic; and
preventing current leakage through the one or more LSSD latch circuits during normal operation of the IC by removing the first input voltage from the power gating circuit, wherein removal of the first input voltage shuts down the power gating circuit and prevents current from flowing through the logic within the one or more LSSD latch circuits.

19. The method of claim 18, wherein said power gating circuit comprises:
a first voltage connection for coupling the power gating circuit to a voltage power source;
a ground voltage connection for coupling the power gating circuit to a ground reference; and
a first transistor having a source terminal coupled to said first voltage connection and a drain terminal coupled to said at least one logic; and
a power gating input coupled to a gate of the first transistor and at which is received a first input voltage, with a selectable magnitude
a second transistor having a source terminal coupled to said at least one logic and a drain terminal coupled to said ground voltage connection; and
an inverter having an input terminal coupled to the power gating input and an output terminal coupled to a gate terminal of the second transistor, said inverter providing an inverted input voltage at the output terminal;
wherein the second transistor turns on for a threshold voltage whose value is the inverse of the threshold voltage at which the first transistor turns on, such that:
when the magnitude of the first input voltage is at least a high threshold voltage required to turn the first transistor on, current flows through the first transistor from the voltage power source to the at least one logic;
when the magnitude of the first input voltage is below the high threshold voltage, no current flows through the first transistor;
when the magnitude of the first input voltage is at least the high threshold voltage required to turn the first transistor on, the inverted input voltage is at most a low threshold voltage required to turn the second transistor on and current flows through the second transistor from the at least one logic to the ground voltage connection; and when the magnitude of the inverted input voltage is above the low threshold voltage required to turn the second transistor on, no current flows through the second transistor.

20. The method of claim 18, wherein said one or more LSSD latch circuits are configured in one of a plurality of latch circuit designs from among:

a first two latch LSSD configuration with a first LSSD latch circuit that includes separate scan logic and data logic and does not include a functional data output coupled to a second LSSD latch circuit composed of scan logic and said functional data output;

a second two latch LSSD configuration with a first LSSD latch circuit composed entirely of scan logic and a second LSSD latch circuit composed of scan logic and said functional data output;

a third two latch LSSD configuration with a first LSSD latch circuit and a second LSSD latch circuit that both include separate scan logic and data logic; and a fourth two latch LSSD configuration with a first LSSD latch circuit that contains separate scan logic and data logic and said functional data output and a second LSSD latch circuit composed entirely of scan logic.

* * * * *